(12) United States Patent
Inuzuka et al.

(10) Patent No.: US 7,180,281 B2
(45) Date of Patent: Feb. 20, 2007

(54) ELECTRICAL COMPONENT AND METHOD OF MANUFACTURING THE SAME

(75) Inventors: Katsuya Inuzuka, Nishio (JP); Tetsuya Ori, Hekinan (JP); Takashi Kurozumi, Toyota (JP); Syunichiro Akimae, Anjo (JP); Kiyokazu Ieda, Chiryu (JP)

(73) Assignee: Aisin Seiki Kabushiki Kaisha, Kariya (JP)

( * ) Notice: Subject to any disclaimer, the term of this patent is extended or adjusted under 35 U.S.C. 154(b) by 4 days.

(21) Appl. No.: 10/830,232

(22) Filed: Apr. 23, 2004

(65) Prior Publication Data

US 2004/0222804 A1   Nov. 11, 2004

(30) Foreign Application Priority Data

Apr. 24, 2003   (JP) .............................. 2003-120562

(51) Int. Cl.
  *G01R 31/02*   (2006.01)
(52) U.S. Cl. ..................... 324/72.5; 324/690
(58) Field of Classification Search ................ 343/867, 343/741, 742, 748, 868; 340/572.1, 545.6, 340/571, 572.6; 324/690, 609, 72.5
  See application file for complete search history.

(56) References Cited

U.S. PATENT DOCUMENTS

| | | | | |
|---|---|---|---|---|
| 4,410,852 A | * | 10/1983 | Guretzky | ..................... 324/725 |
| 4,760,394 A | * | 7/1988 | Takeuchi et al. | .......... 340/10.42 |
| 5,070,241 A | * | 12/1991 | Jack | ........................ 250/336.2 |
| 5,995,064 A | * | 11/1999 | Yanagisawa et al. | ....... 343/895 |
| 6,075,294 A | | 6/2000 | Van den Boom et al. | |
| 6,304,182 B1 | * | 10/2001 | Mori et al. | ............... 340/572.1 |
| 6,338,812 B1 | * | 1/2002 | Ogura | ........................ 264/254 |
| 6,492,893 B2 | * | 12/2002 | De Graaf | ..................... 336/229 |
| 6,664,899 B1 | * | 12/2003 | Tsuchihashi | ........... 340/825.69 |
| 2002/0033777 A1 | | 3/2002 | Maruyama et al. | |

FOREIGN PATENT DOCUMENTS

| | | |
|---|---|---|
| EP | 0 943 764 A1 | 9/1999 |
| EP | 1 244 175 A1 | 9/2002 |
| JP | 63-187706 | 8/1988 |
| JP | 10-41727 | 2/1998 |

\* cited by examiner

*Primary Examiner*—Vincent Q. Nguyen
(74) *Attorney, Agent, or Firm*—Buchanan Ingersoll & Rooney PC (57) ABSTRACT

An electrode is made by turning a harness such that the electrode has a predetermined are for detecting capacitance. A method of manufacturing of an electrode includes step so turning a wire, and shaping the electrode with the wire. The electrode has a predetermined area for detecting capacitance.

20 Claims, 4 Drawing Sheets

ELECTRICAL COMPONENT AND METHOD OF MANUFACTURING THE SAME

CROSS REFERENCE TO RELATED APPLICATIONS

This application is based on and claims priority under 35 U.S.C. § 119 to Japanese Patent Application 2003-120562, filed on Apr. 24, 2003, the entire content of which is incorporated herein by reference.

FIELD OF THE INVENTION

This invention generally relates to an electrical component and a method of manufacturing the same.

BACKGROUND

U.S. Pat. No. 6,075,294 (corresponding to Japanese Application Publication No. JP2000-500001) discloses a door lock system including a door-releasing sensor. The door-releasing sensor detects human body by detecting electric capacitance change. More particularly, the door-releasing sensor is a capacitance sensor having a first electrode provided in a door grip and a door body opposite to the door grip. The door body acts as a second electrode in this case. The door-releasing sensor detects a capacitance change that occurs by inserting a body, of which permittivity is different from the one of air, e.g., human's hand etc., between the first and second electrodes. As described above, the first and second electrodes can be hence used as a human detecting sensor.

A need exists for providing an electrical component such as the capacitance sensor which can be electrically connected to an exterior member with less burden, and further for providing a method of manufacturing the electrical component.

SUMMARY OF THE INVENTION

According to an aspect of the present invention, an electrical component includes a wire having an electrode portion for detecting capacitance. The electrode portion is shaped by turning the wire, so that the electrode portion (34a) has a predetermined area for detecting the capacitance.

It is preferable that the wire can be an insulation wire having an electric core and an insulation coating layer surrounding the electric core. In this case, the at least one means for molding applies heat to the electrode portion. Therefore, each adjacent wire portion at the electrode portion is welded.

It is preferable that the electrode portion (34a) is assumed to have a flat plate shape with the predetermined area for detecting the capacitance.

According to another aspect of the present invention, there is another electrical component including an insulation wire having an antenna portion shaped by turning the insulation wire for sending or receiving a radio signal. The insulation wire has an electric core and an insulation coating layer surrounding the electric core.

It is preferable that a magnetic body is coiled with the insulation wire. The antenna portion is positioned at the magnetic body. The magnetic body with the antenna portion is applied with heat. The antenna portion is compressed and welded by at least one means for molding.

It is also preferable that only the antenna portion is compressed by at least one means for molding, so that the antenna portion is molded. Further, the at least one means for molding applies heat to the antenna portion. Each adjacent wire portion at the antenna portion is welded. Still further, the magnetic body can be coiled with the insulation wire at the antenna portion, wherein the at least one means for molding compresses and applies heat to the antenna portion at the magnetic body. Therefore, the each adjacent wire portion at the antenna portion is welded.

According to further aspect of the present invention, a method of manufacturing an electrical component includes the steps of turning a wire, and shaping an electrode portion with the wire. The electrode portion has a predetermined area for detecting capacitance.

It is preferable that the wire can be an insulation wire having an electric core and an insulation coating layer. The at least one means for molding applies heat to the insulation wire such that the insulation coating layer is hardened.

It is preferable that the electrode portion is assumed to have a flat plate shape with the predetermined area for detecting the capacitance.

According to still further aspect of the present invention, another method of manufacturing another electrical component includes the steps of turning an insulation wire having an electric core and an insulation coating layer surrounding the electric core, and shaping an antenna portion with the insulation wire so as to send or receive a radio signal.

It is preferable that the insulation wire is coiled around a magnetic body, wherein the antenna portion is positioned at the magnetic body. In this case, the method includes the steps of applying heat to the magnetic body with the insulation wire, and compressing the antenna portion by at least one means for molding, wherein the antenna portion (32a) is hardened.

It is also preferable that the method of manufacturing another electric component further includes the steps of compressing the antenna portion by at least one means for molding such that the antenna portion is molded. In this case, the antenna portion is applied with heat, wherein each adjacent wire portion at the antenna portion is hardened. The method can further include the steps of winding the insulation wire around a magnetic body at the antenna portion. The at least one means for molding compresses and applies heat to the antenna portion at the magnetic body. Therefore, the each adjacent wire portion at the antenna portion is hardened.

BRIEF DESCRIPTION OF THE DRAWINGS

The foregoing and additional features and characteristics of the present invention will become more apparent from the following detailed description considered with reference to the accompanying drawings, wherein:

FIGS. 3(a1) and 3(a2) are elevational and cross-sectional views, respectively, illustrating a method of processing a transmitting antenna according to the embodiment of the present invention;

FIGS. 3(b1) and 3(b2) are elevational and cross-sectional views, respectively, illustrating a method of processing a door releasing sensor according to the embodiment of the present invention;

DETAILED DESCRIPTION

Figure 1:
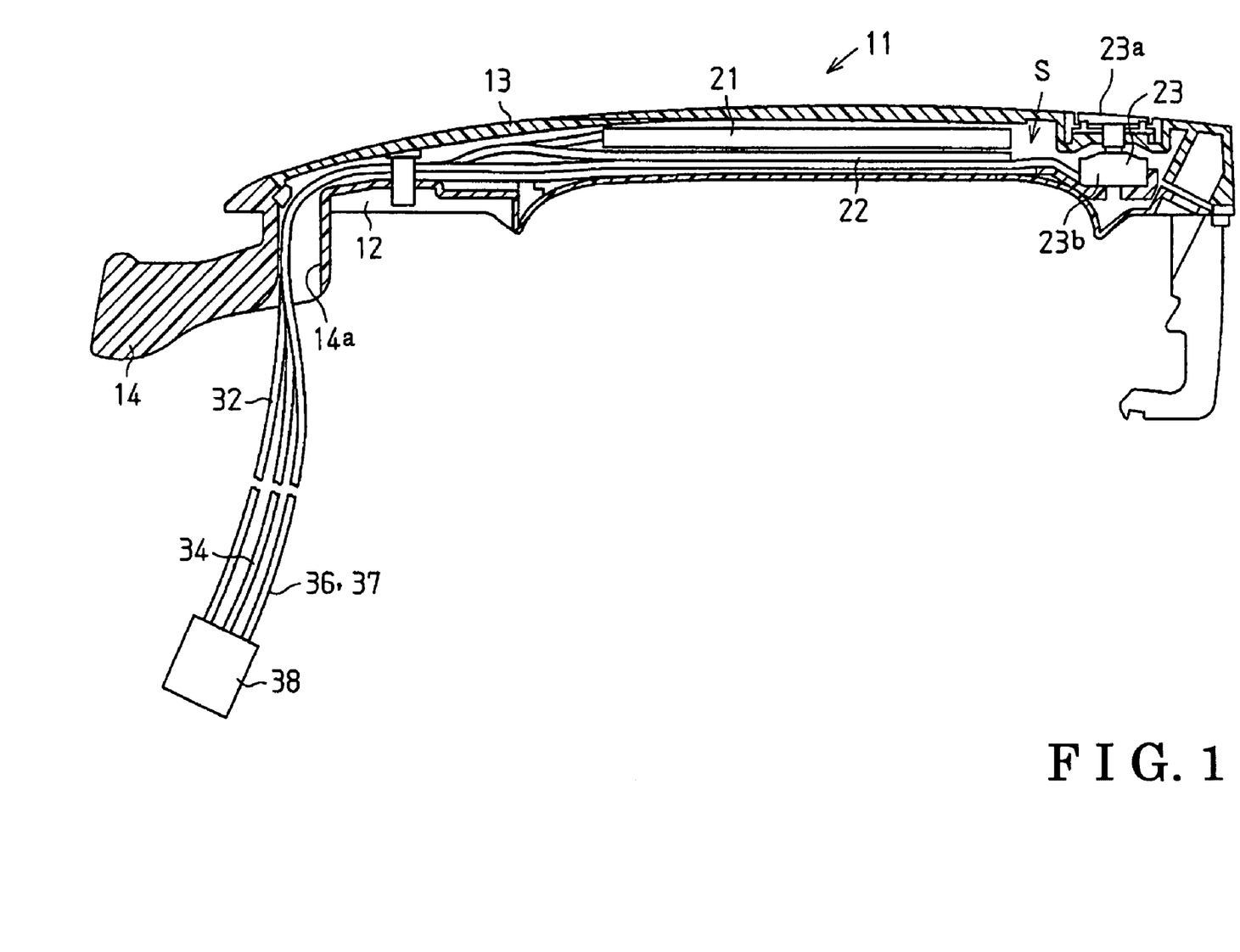
FIG. 1 is a cross sectional view illustrating a door handle according to an embodiment of the present invention.

As illustrated in FIG. 1, a door handle 11 according to an embodiment of the present invention is operated for opening/closing a vehicle door. The door handle 11 includes a handle main body 12 and a handle cover 13 placed to cover the handle main body 12. The handle cover 13 defines a designing portion of a vehicle exterior. The door handle 11 further includes a door hinge arm portion 14 at one side of the handle main body 12, i.e., at a left side in FIG. 1. An inner shell S is defined in a closed space between the handle main body 12 and the handle cover 13. The inner shell S houses a transmitting antenna 21 and a door releasing sensor 22, both of which are electrical components. According to the embodiment of the present invention, the transmitting antenna 21 is preferably placed at a side of the handle cover 13, while the door releasing sensor 22 is preferably placed at a side of the handle main body 12. The transmitting antenna 21 and the door releasing sensor 22 are preferably in relation of superposition.

Figure 2:
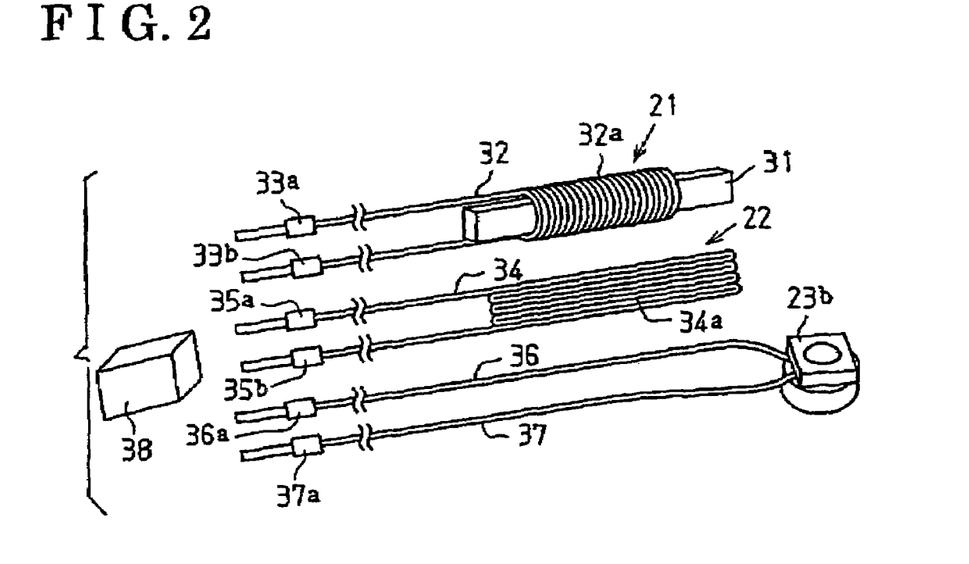
FIG. 2 is an exploded view illustrating of the door handle illustrated in FIG. 1.
Figure 6:
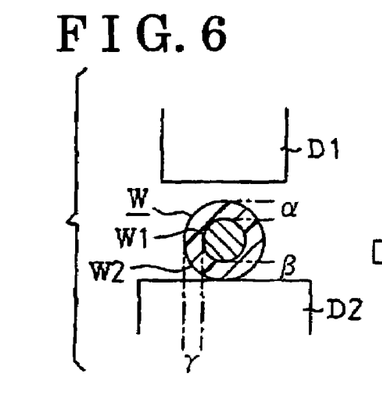
FIG. 6 is a pattern diagram illustrating a first stage of processing a harness according to the embodiment of the present invention.
Figure 6A:
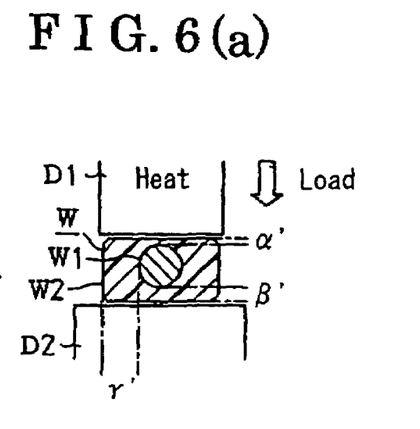
FIG. 6(a) is a pattern diagram illustrating a second, compression stage of processing the harness.

The transmitting antenna 21 is one of the electrical components configuring a system for enhancing convenience of the door opening/closing operation. For example, the transmitting antenna 21 can transmit or receive a signal to or from a portable device carried by a user who intends to open/close the vehicle door. As illustrated in FIG. 2, the transmitting antenna 21 includes a magnetic body, such as an approximately rectangular shaped ferrite core 31 as a non-limiting example, and a wire harness 32 as an insulation wire. The harness 32 directly winds around the ferrite core 31 like a coil. Therefore, the transmitting antenna 21 has a loop antenna shaped structure. That is, the harness 32 has an antenna portion 32a coiled around the ferrite core 31. The antenna portion 32a can be preferably coiled around the ferrite core 31 with a single stroke. Therefore, the harness 32 has plural adjacent harness portions at the antenna portion 32a, i.e., near the ferrite core 31 coiled with the harness 32. According to the embodiment of the present invention, each adjacent harness portion is welded as described later. The harness 32 (the insulation wire) has an electric core W1 and an insulation coating layer W2 as an insulation material. The coating layer W2 can coaxially cover the electric core W1, as illustrated in FIG. 6, 6(a).

A waterproof connector terminal 33a is caulked at one end of the harness 32, while a waterproof connector terminal 33b is caulked at the other end thereof. These two ends with the connector terminals 33a and 33b are guided to an outer side of the door handle 11 through a guiding bore 14a communicating with the inner shell S. These two ends are further guided into the vehicle door side.

The ferrite core 31 according to the embodiment of the present invention is an Mn—Zn based ferrite. The electric core W1 of the harness 32 is made from soft copper wires. The coating layer W2 is made from insulating material, e.g., thermoplastic resin such as vinyl chloride resin as a non-limiting example. The coating layer W2 has approximately 0.3 mm length in radius for coaxially coating the electric core W1 therein. The length in radius of the coating layer W2 is not limited to the approximately 0.3 mm length as far as the coating layer W2 has an enough length such that the coating layer W2 is not easily torn. The harness 32 according to the embodiment of the present invention can be represented by a genaral-purpose wire harness.

The door releasing sensor 22 is one of the electrical components configuring the system for enhancing convenience of the door opening/closing operation. For example, the door releasing sensor 22 can detect capacitance change in response to approaching or touching of a hand to the door handle 11. As illustrated in FIG. 2, the door releasing sensor 22 includes a wire harness 34 as an insulation wire. The harness 34 has an electrode 34a (i.e., an electrode portion) curved like a meander along a longitudinal direction of the door handle 11. Therefore, the harness 34 has plural adjacent harness portions at the electrode portion 34a. According to the embodiment of the present invention, each adjacent harness portion of the electrode 34a is welded as described later.

A waterproof connector terminal 35a is caulked at one end of the harness 34, while a waterproof connector terminal 35b is caulked at the other end thereof. These two ends with the connector terminals 35a and 35b are also guided to the outer side of the door handle 11 through the guiding bore 14a penetrating the door hinge portion 14. These two ends are further guided into the vehicle door side.

The harness 34 according to the embodiment of the present invention can be also represented by a genaral-purpose wire harness in the same manner as the harness 32. The electrode 34a of the door releasing sensor 22 has a straight line shape with a single stroke. The straight line shaped electrode 34a is bent to have a plurality of physically turned portions. Approaches by the inventors show that the electrode 34a with the aforementioned structure can appear to be substantially a flat plate at a LF band (a low frequency band) and can detect the capacitance change. That is, the door releasing sensor 22, i.e., the electrode 34a can be assumed to be a flat plate type electrode having a flat type occupation area (i.e., a predetermined area).

A door locking switch 23 is provided at the other side of the door handle 11, i.e., at a right side in FIG. 1. The door locking switch 23 includes a button 23a disposed at the handle cover 13 and a detecting portion 23b placed corresponding to the button 23a in the handle main body 12. Further, the button 23a exposes at the designing portion of the handle cover 13, while the detecting portion 23b is housed in the inner shell S. The door locking switch 23 is one of the electrical components configuring the system for enhancing the convenience of the door opening/closing operation. For example, the door locking operation by the user can be recognized by the detecting portion 23b detecting a pushing operation of the button 23a.

As illustrated in FIG. 2, the detecting portion 23b is connected to genaral-purpose wire harnesses 36 and 37. That is, the detecting portion 23b is connected to one end of each harness 36 and 37 in the door handle 11, while waterproof connector terminals 36a and 37a are caulked to the other ends of the harnesses 36 and 37. The other ends of the harnesses 36 and 37 with the connector terminals 36a and 37a are also guided to the outer side of the door handle 11. The other ends are further guided into the vehicle door.

Each connector terminal 33a, 33b, 35a, 35b, 36a, and 37a is individually inserted into a waterproof connector housing 38 via each terminal inserting portion (not shown) defined at the connector housing 38 corresponding to each connector terminal. The transmitting antenna 21, the door releasing sensor 22, and the door locking switch 23 are electrically connected to electrical components in the vehicle door via the connector housing 38. According to the embodiment of the present invention, at least one of the connector terminals 35a and 35b of the door releasing sensor 22 is not electrically connected to the electrical components and is released, whereby the door releasing sensor 22 can be isoelectric. Alternatively, both of the waterproof connector terminals 35a and 35b can be under a short circuit while being inserted into the connector housing 38.

Following explanation will be given for explaining methods of processing the transmitting antenna 21 and the door releasing sensor 22 according to the embodiment of the present invention with reference to FIGS. 3 through 7.

Figure 3:
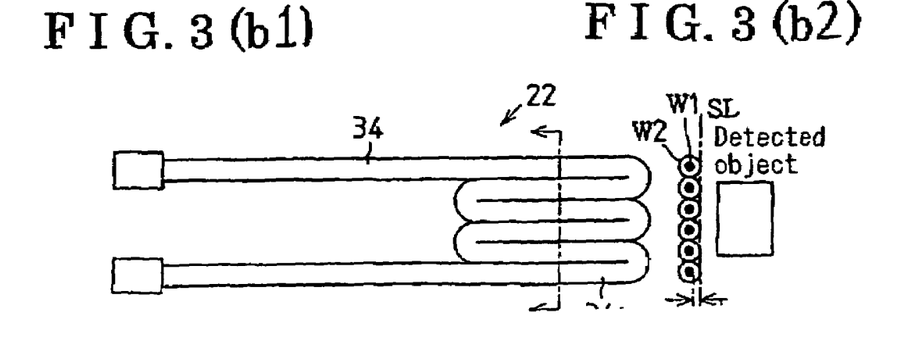

FIG. 3(a1), 3(a2) are elevational and cross-sectional views, respectively, illustrating the transmitting antenna 21 with the ferrite core 31 immediately after being coiled with the harness 32. The antenna portion 32a is smoothly turned relying upon a self flexibility and is coiled around the ferrite core 31 with a lateral clearance C1 relative to the ferrite core 31. Further, the electric core W1 of the antenna portion 32a is away from the ferrite core 31 with a thickness T of the insulation coating layer W2 as the basis of an inner peripheral side of the antenna portion 32a. Therefore, performance of the transmitting antenna 21 may be deteriorated in response to the distance between the electric core W1 of the antenna portion 32a and the ferrite core 31.

FIG. 3(b1), 3(b2) are elevational and cross-sectional views, respectively, illustrating the door releasing sensor 22 with the harness 34 immediately after being turned like a meander. A standard line SL for positioning the electrode 34a in the door handle 11 is fixed at a side of a detected subject. In this case, a core W1 of the electrode 34a is away from the detected subject with a thickness T of an insulation coating layer W2 relative to the standard line SL. Therefore, a detecting performance of the door releasing sensor 22 may be deteriorated.

Figure 7:
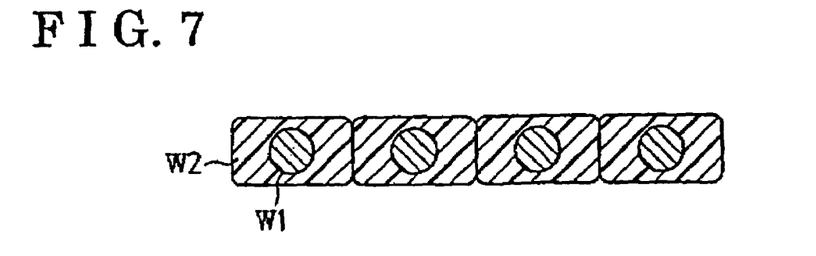
FIG. 7 is another pattern diagram illustrating the principle of processing the harness wherein adjacent wire portions are not integrated, according to the embodiment of the present invention.

Following explanation will be given for explaining a principle regarding to processing of the antenna portion 32a and the electrode 34a with reference to FIGS. 6 and 7.

FIG. 6(a), 6(b) are pattern diagrams illustrating a single insulation wire W representing each harness 32 and 34 (the antenna portion 32a and the electrode 34a), a first molding head D1, and a second molding head D2. The insulation wire W includes an electric core W1 and an approximately cylindrical insulation coating layer W2 covering the electric core W1. For example, the insulation wire W is placed on the second molding head D2. In this case, the insulation coating layer W2 has α thick, β thick, and γ thick in a radial direction at the first molding head D1 side, at the second molding head D2 side, and at sides penetrating the first and second molding head sides. Generally, the electric wire W1 is provided substantially coaxially relative to the insulation coating layer W2, wherein the α thick, β thick, and γ thick is substantially equivalent.

Under the aforementioned condition of the insulation wire W, the first molding head D1 heated up to a predetermined temperature approaches towards the second molding head D2 and applies heat and load to the insulation wire W. The insulation wire W is hence compressed. The predetermined temperature of the first molding head D1 should be equal to or higher than a glass transition temperature of a thermoplastic resin (as a non-limiting example) and equal to or lower than a melting point thereof. The glass transition temperature is designed at a level where the insulation coating layer W2 is molded. Therefore, the insulation coating layer W2 made of the thermoplastic resin deforms along with resin flow therein. Flow property of this resin depends on a temperature thereof. For example, the higher is the temperature, the more is the resin flow property, wherein the coating layer W2 deforms greatly. The α thick of the coating layer W2 at the first molding head D1 side is compressed, i.e., is diminished down to α' thick ($\alpha' < \alpha$). The β thick of the coating layer W2 at the second molding head D2 side is compressed, is diminished down to β' thick ($\beta' < \beta$). On the other hand, the γ thick of the coating layer W2 at the side penetrating the first and second molding head sides is expanded, i.e., is increased up to γ' thick ($\gamma' > \gamma$). That is, according to the deformation of the insulation coating layer W2, some portions of the insulation coating layer W2 becomes thinner compared to an initial condition, while other portions thereof becomes thicker, as explained above.

When the heating temperature of the first molding head D1 is substantially equal to a temperature or a heating temperature of the second molding head D2, a relationship between the α' thick and the β' thick is expressed in accordance with the equation: $\alpha' \approx \beta'$. On the other hand, when the heating temperature of the first molding head D1 is higher than the temperature or the heating temperature of the second molding head D2, the relationship between the α' thick and the β' thick is expressed in accordance with the equation: $\alpha' < \beta'$. Further, when the heating temperature of the first molding head D1 is lower than the temperature or the heating temperature of the second molding head D2, the relationship therebetween is expressed in accordance with the equation: $\alpha' > \beta'$. According to the embodiment of the present invention, each of the α' thick and the β' thick can be adjusted depending upon load and heat applied to each of the first and second molding heads D1 and D2. Each of the α' thick and the β' thick can be adjusted as intended within a range including the thickness α or the thickness β. The range further can includes a thickness zero substantially corresponding to a condition in which the electric core W1 is exposed.

Figure 7A:
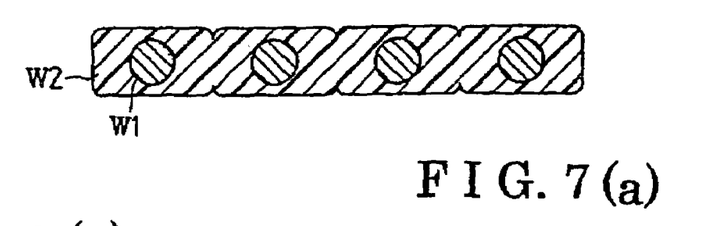
FIG. 7(a) is a pattern diagram similar to FIG. 7 wherein adjacent wire portions are integrated.

Following explanation will be given for explaining a condition between each adjacent insulation wire W with reference to FIG. 7(a). FIG. 7 illustrates the condition of the insulation wire W when being applied with a predetermined temperature lower than the melting point of the resin of the insulation coating layer W2, while FIG. 7(a) illustrates the condition of the insulation wire W heated up to a temperature close to the melting point of the resin of the insulation coating layer W2.

When the insulation coating layer W2 is heated at the predetermined temperature lower than the melting point, the insulation coating layer W2 does not reach to a melted condition. Therefore, each adjacent insulation wire W is hardened under a separated condition (FIG. 7). On the other hand, when the insulation coating layer W2 is heated up to the temperature near the melting point, each adjacent insulation wire W is solidly hardened under the melted condition (FIG. 7(a)).

Plasticizing material included in the insulation coating layer W2 is vaporized after heating the insulation coating layer W2 for a sufficient time. This may accelerate hardening the insulation wire W. This plasticizing material has been well known as a material for making the resin of the insulation wire W flexible and yielding. The plasticizing material is represented by stearic acid of a plastic, as a non-limiting example.

Based upon the above-described principle, following explanation will be given for explaining the method of processing the transmitting antenna 21 and the door releasing sensor 22 according to the embodiment of the present invention.

Figure 4:
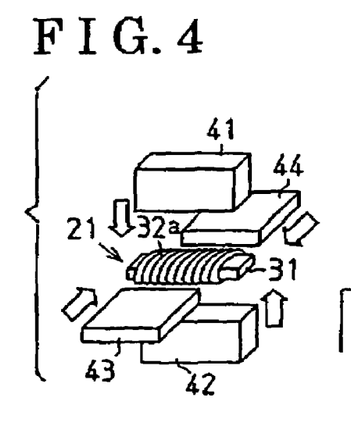
FIG. 4 is a schematic perspective view illustrating the method of processing the transmitting antenna according to the embodiment of the present invention.
Figure 4A:
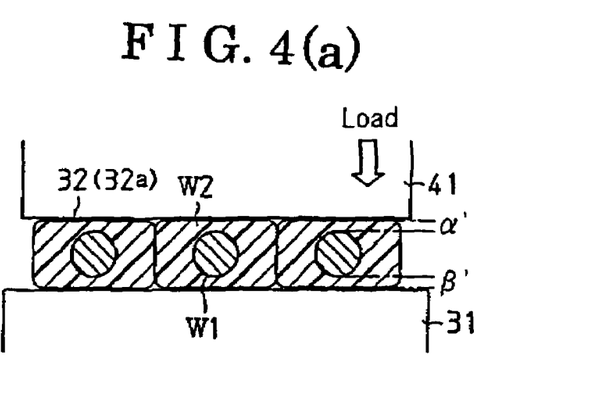
FIG. 4(a) is a sectional view showing opposed devices compressing a coiled wire in FIG. 4.

FIG. 4, 4(a) are a pattern diagrams illustrating the method of processing the transmitting antenna 21 with the ferrite core 31 immediately after being coiled with the harness 32. The transmitting antenna 21 is surrounded by a first molding head 41 as means for molding, a second molding head 42 as the means for molding, a third molding head 43, and a fourth molding head 44. The first molding head 41 is positioned at an upper side of the transmitting antenna 21, while the second molding head 42 is positioned at a lower side thereof. The third molding head 43 is positioned at a left side penetrating an axial direction of the ferrite core 31, while the fourth molding head 43 is positioned at a right side penetrating the axial direction thereof. At least one of the first and second molding heads 41 and 42 is heated up to the temperature close to the melting point of the insulation coating layer W2 of the harness 32. Under this condition of the harness 32, the respective first, second, third, and fourth molding heads 41, 42, 43, and 44 are moved to the antenna portion 32a and applies a predetermined load to the antenna portion 32a from fourth sides. Therefore, the antenna portion 32a can be positioned by being sandwiched or closed between the third and fourth molding heads 43 and 44, and then can be compressed by being sandwiched or closed between the first and second molding heads 41 and 42.

As described above, the harness 32 at the first molding head 41 side relative to the ferrite core 31 is compressed with the heat and load from the ferrite core 31 and the first molding head 41. Therefore, the first molding head 41 and the ferrite core 31 correspond to the first molding head D1 and the second molding head D2 illustrated in FIG. 6, respectively. In the same manner, the harness 32 at the second molding head 42 side relative to the ferrite core 31 is compressed with the heat and load from the ferrite core 31 and the second molding head 42. Therefore, the ferrite core 31 and the second molding head 42 correspond to the first molding head D1 and the second molding head D2 illustrated in FIG. 6, respectively.

As described above, according to the embodiment of the present invention, the clearance C1 between the antenna portion 32a and the ferrite core 31 can be decreased or cancelled in response to the compression of the harness 32. The thickness T of the insulation coating layer W2 at the ferrite core 31 side can be effectively decreased. Therefore, the electric core W1 of the harness 32 becomes closer to the ferrite core 31, thereby enhancing the performance of the transmitting antenna 21.

Further as described above, the insulation coating layer W2 of the harness 32 can be heated up to the temperature close to the melting point by use of the first molding head 41, the second molding head 42, and the ferrite core 31. In this case, each adjacent harness portion at the antenna portion 32a can be melted and solidly hardened, as illustrated in FIG. 7(a). Further, according to the embodiment of the present invention, the plasticizing material included in the insulation coating layer W2 is vaporized by heating the coating layer W2 for the sufficient time. Therefore, it can accelerate hardening the harness 32. Still further, as described above, the relationship between the $\alpha'$ thick and the $\beta'$ thick can be adjusted in response to the temperatures (and the heating required times) of the first molding head 41, the second molding head 42, and the ferrite core 31.

Figure 5:
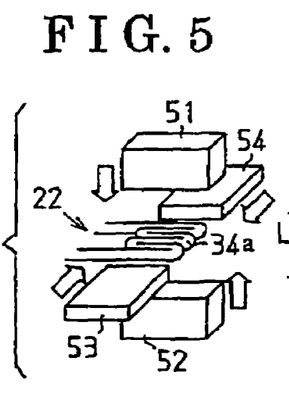
FIG. 5 is a schematic perspective view illustrating the method of processing the door releasing sensor according to the embodiment of the present invention.
Figure 5A:
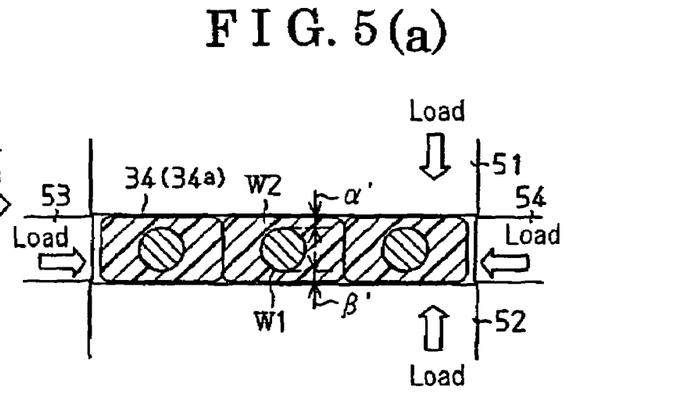
FIG. 5(a) is a sectional view showing opposed devices compressing a meandered wire in FIG. 5.

FIG. 5, 5(a) are pattern diagrams illustrating the method of processing the door releasing sensor 22 with the harness 34 immediately after being curved like the meander. The door releasing sensor 22 is surrounded by a first molding head 51 as the means for molding, a second molding head 52 as the means for molding, a third molding head 53, and a fourth molding head 54. The first molding head 51 is positioned at an upper side of the door releasing sensor 22, while the second molding head 52 is positioned at a lower side thereof. The third molding head 53 is positioned at a left side penetrating an axial direction of the electrode 34a, while the fourth molding head 54 is positioned at a right side penetrating the axial direction thereof. At least one of the first and second molding heads 51 and 52 is heated up to the temperature close to the melting point of the insulation coating layer W2 of the harness 34. Under this condition of the harness 34, the respective first, second, third, and fourth molding heads 51, 52, 53, and 54 are moved to the electrode 34a and applies load to the electrode 34a from fourth sides. Therefore, the electrode 34a can be positioned by being sandwiched or closed between the third and fourth molding heads 53 and 54, and further can be compressed with heat and load by being sandwiched or closed between the first and second molding heads 51 and 52. As described above, the first molding head 51 and the second molding head 52 correspond to the first molding head D1 and the second molding head D2 illustrated in FIG. 6.

As described above, according to the embodiment of the present invention, the thickness T of the insulation coating layer W2 at the electrode 34a can be effectively decreased. Therefore, the electric core W1 of the harness 34 becomes closer to the detected subject, thereby enhancing the detecting performance of the door releasing sensor 22.

Further as described above, the insulating coating layer W2 of the harness 34 can be heated up to the temperature close to the melting point by use of the first and second molding heads 51 and 52. In this case, each adjacent harness portion at the electrode 34a can be melted and solidly hardened, as illustrated in FIG. 7(a). Further, according to the embodiment of the present invention, the plasticizing material included in the insulation coating layer W2 is vaporized by heating the coating layer W2 for the sufficient time. Therefore, it can accelerate hardening the harness 34. Still further, as described above, the relationship between the $\alpha'$ thick and the $\beta'$ thick can be adjusted in response to the temperatures (and the heating required times) of the first molding head 51 and the second molding head 52.

As described above, following effects can be obtained as a non-limiting example according to the embodiment of the present invention.

(1) The antenna portion 32a is made from the harness 32 coiled around the ferrite core 31. That is, the antenna portion 32a is formed continuously with the harness 32 electrically connected to the exterior member. Therefore, it is possible to decrease a burden of electrically connecting the insulation wire (the harness) to an antenna separately provided.

(2) The antenna portion 32a is formed by compressing the harness 32 coiled around the ferrite core 31. The clearance C1 between the antenna portion 32a and the ferrite core 31 can be hence decreased or cancelled, while the thickness T of the insulation coating layer W2 can be decreased in response to the compression of the harness 32. Therefore, the electric core W1 of the harness 32 can become closer to the ferrite core 31 in response to the decrease of the thickness T, thereby enhancing the performance of the transmitting antenna 21.

(3) The insulation coating layer W2 of the harness 32 is hearted up to the temperature close to the melting point by use of the first molding head 41, the second molding head 42, and the ferrite core 31. Each adjacent harness portion at the antenna portion 32a can be hence melted and solidly hardened. Further, the plasticizing material included in the insulation coating layer W2 is vaporized by heating the coating layer W2 for the sufficient time. Therefore, it can accelerate hardening the harness 32. Therefore, the position and shape of the antenna portion 32a can be stabilized and the performance thereof can be stabilized.

(4) The electrode 34a for detecting the capacitance is assumed to have a flat plate shape structure with the curved harness 34. That is, the electrode 34a can be formed continuously with the harness 34 electrically connected to the exterior member. Therefore, it is possible to decrease a burden of electrically connecting the insulation wire (the harness) to a flat plate type electrode that detects the capacitance and is provided separately.

(5) The thickness of the insulation coating layer W2 can be decreased in response to the compression of the harness 34. Therefore, the electrical core W1 of the harness 34 can become closer to the detected subject in response to the decrease of the thickness of the insulation coating layer W2, thereby enhancing detection sensitivity thereof. The electrical core W1 practically includes an electrode structure.

(6) The insulation coating layer W2 of the harness 34 can be heated up to the temperature close to the melting point thereof by use of the first molding head 51 and the second molding head 52. Each adjacent harness portion at the electrode 34a can be hence melted and solidly hardened. Further, according to the embodiment of the present invention, the plasticizing material included in the insulation coating layer W2 is vaporized by heating the coating layer W2 for the sufficient time. Therefore, it can accelerate hardening the harness 34. Therefore, the position and shape of the electrode 34a can be stabilized, and further detection sensitivity thereof can be also stabilized.

The present invention is not limited to the above-described preferred embodiment and can be modified as described below.

Figure 8A:
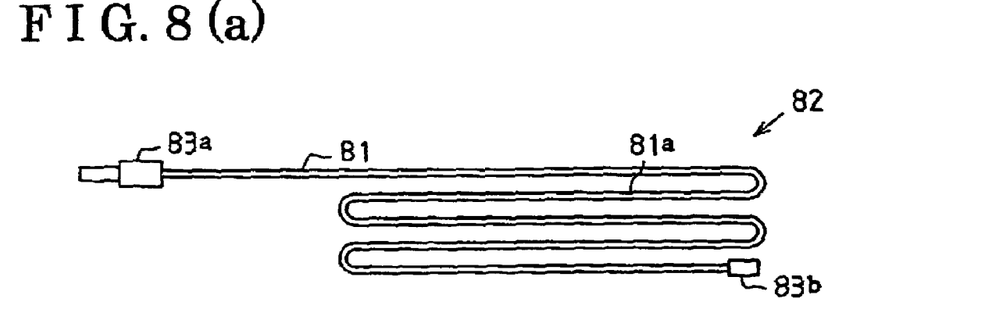
FIGS. 8(a), (b), and (c) are views illustrating a door releasing sensor according to three respective modified embodiments of the present invention.

According to the above-described embodiment of the present invention, the door handle 11 includes the door releasing sensor 22 having the electrode 34a made from the harness 34 turned along the longitudinal direction of the door handle 11 with the meander shape. The two ends of the harness 34 are guided to the outer side of the door handle 11 through the guiding bore 14a. Alternatively, as illustrated in FIG. 8(a), the door handle 11 can include a door releasing sensor 82 in substitution for the door releasing sensor 22. The door releasing sensor 82 has an electrode 81a made from a wire harness 81 curved along the longitudinal direction of the door handle 11 with a meander shape. One end of the harness 81 can be guided to the outer side of the door handle 11 through the guiding bore 14a. That is, the one end of the harness 81 is caulked with a waterproof connector terminal 83a inserted into the connector housing 38, while the other end thereof can be closed with a sealing member 83b. As described above, the electrode 81a can be formed.

Figure 8B:
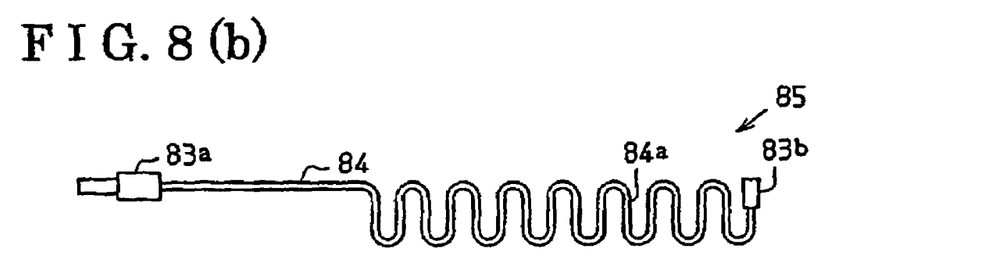
Figure 8C:
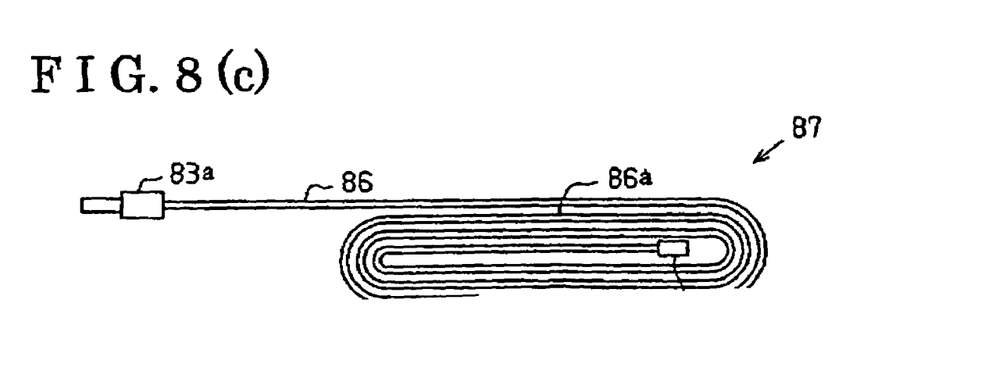

Further alternatively, as illustrated in FIG. 8(b), the door handle 11 can include a door releasing sensor 85 in substitution for the door releasing sensor 22. The door releasing sensor 85 has an electrode 84a made from a wire harness 84 curved along a lateral direction of the door handle 11 with the meander shape. Still further alternatively, as illustrated in FIG. 8(c), the door handle 11 can include a door releasing sensor 87 in substitution for the door releasing sensor 22. The door releasing sensor 87 has an electrode 86a made from a wire harness 86 curved with a spiral shape. Further, the door releasing sensor can include an electrode portion assumed to be a flat plate shape by curing a harness with any shape, such as a crank shape as a non-limiting example. Still further, the door releasing sensor can include an electrode portion assumed to be a flat plate shape by curving a harness with a humilis shape. Whichever shape the harness is curved with, one end of the harness is caulked with the waterproof connector terminal 83a, while the other end thereof is caulked with the sealing member 83b as a sealing member, or with a heat contracting tube.

According to the above-described embodiment of the present invention, the insulation coating layer W2 of the harness 32 (and the harness 34) is heated up to the temperature close to the melting point by use of the first molding head 41 (the first molding head 51 for the harness 34) and the second molding head 42 (the second molding head 52). Therefore, each adjacent harness portion at the antenna portion 32a is melted, and each adjacent harness portion at the electrode 34a is melted. Alternatively, the insulation coating layer W2 of each harness 32 and 34 can be only hardened. In this case, the plasticizing material included in the insulation coating layer W2 is vaporized for hardening each harness 32 and 34. When the insulation coating layer W2 is made of an ultraviolet radiation hardening resin as a non-limiting example, the insulation coating layer W2 can be illuminated with ultraviolet radiation so as to be hardened.

According to the above-described embodiment of the present invention, the ferrite core 31 is indirectly heated by use of the first and second molding heads 41 and 42. Alternatively, the ferrite core 31 can be directly applied with heat. Therefore, the thickness T of the insulation coating layer W2 can be preferably designed by more reliably adjusting a temperature at the ferrite core 31 side.

According to the above-described embodiment of the present invention, the first molding heads 41 and 51, and the second molding heads 42 and 52 can be applied with heat by use of a heater with heating elements and a heat block.

According to the above-described embodiment of the present invention, the transmitting antenna 21 includes the ferrite core 31. Alternatively, the transmitting antenna 21 does not have to include the ferrite core 31.

According to the above-described embodiment of the present invention, the door handle 11 includes the door locking switch 23. Alternatively, the door handle 11 can include a switch or a sensor of which shape corresponds to the shape of the door releasing sensor 22, in substitution for the door locking switch 23. That is, the door locking switch 23 can be substituted by a door locking switch or sensor including at least one of the electrodes 34a, 81a, 84a, and 86a of the door releasing sensors 22, 82, 85, and 87.

The arrangement of the transmitting antenna 21, the door releasing sensor 22, and the door locking switch 23 according to the above-described embodiment is one of examples. The arrangement thereof can be altered as needed.

According to the above-described embodiment of the present invention, each of the transmitting antenna 21 and the door releasing sensor 22 includes each of the harness 32 and 34. Each harness includes the isolation coating layer W2 as the isolation wire, which is molded with the thermoplastic resin such as vinyl chloride resin as a non-limiting example. Alternatively, the isolation coating layer can be molded with an isolation material such as a rubber (e.g., a thermoplastic rubber), or an enamel as a non-limiting example.

According to the above-described embodiment of the present invention, each door releasing sensor 22, 82, 85, 87 is made from the insulation wire such as the harness 34, 81, 84, and 86. Alternatively, each door releasing sensor can be made from an exposed wire. In this case, wire rods of this type of exposed wire can be copper, iron, or aluminum as non-limiting examples.

The electrical components housed in the door handle 11 can be changed in accordance with a door opening/closing function as needed. That is, the electrical components in the door handle 11 can be changed in accordance with an operating system such as an E-latch system, a smart entry system, as a non-limiting example.

The above-described embodiment of the present invention is applied to the electrical components such as the transmitting antenna 21, the door releasing sensors 22, 82, 85, or 87. However, the above-described embodiment of the present invention can be applied to an electrical component provided at each device that is different from a vehicle door.

According to the above-described embodiment of the present invention, the door handle 11 includes plural electrical components. However, the above-described embodiment of the present invention can be applied even for a single electrical component.

The principles, embodiments, and modes of operation of the present invention have been described in the foregoing specification and drawings. However, the invention which is intended to be protected is not to be construed as limited to the particular embodiments disclosed. Further, the embodiments described herein are to be regarded as illustrative rather than restrictive. Plural objectives are achieved by the present invention, and yet there is usefulness in the present invention as far as one of the objectives are achieved. Variations and changes may be made by others, and equivalents employed, without departing from the spirit of the present invention. Accordingly, it is expressly intended that all such variations, changes, and equivalents which fall within the spirit and scope of the present invention as defined in the claims, be embraced thereby.

The invention claimed is:

1. A method of manufacturing an electric component capable of detecting-capacitance, comprising:
   A) arranging a wire in a meandering configuration, the wire including an electrically conductive core surrounded by an insulation coating layer; and
   B) heating and compressing the meandering wire configuration for reshaping the meandering wire configuration to define an electrode portion having a predetermined area for detecting capacitance, and wherein a thickness of a portion of the insulation coating layer of the electrode portion is reduced, wherein the electrode portion is in the form of a quasi-flat plate shape.

2. A method of manufacturing an electrical component as set forth in claim 1, wherein the temperature of heat is less than a melting point of a raw material of the insulating coating layer of the insulation wire.

3. A method of manufacturing an electrical component as set forth in claim 1, wherein the temperature of heat is not less than a melting point of a raw material of the insulating coating layer of the insulation wire.

4. A method of manufacturing an electrical component as set forth in claim 1, wherein the compression of the insulation wire is established in such manner that the insulation wire is sandwiched in a first direction between a pair of opposed devices, at least one of the devices being heated up to the temperatures.

5. A method of manufacturing an electrical component as set forth in claim 1, wherein the compression of the insulation wire is established in such manner that the insulation wire is sandwiched in a first direction between a pair of opposed devices, at least one of the devices is heated up to the temperature and is also sandwiched in a second direction perpendicular to the first direction between another pair of opposed devices, at least one of the four devices being heated up to the temperatures.

6. An electrical component comprising an electrode portion for detecting capacitance, the electrode portion being produced by the method of any one of claims 1 and 2–5.

7. A method of manufacturing an electric component capable of sending or receiving radio waves, comprising the steps of:
   A) coiling an insulation wire having an electric core and an insulating coating layer surrounding the electric core; and
   B) heating and compressing the coiled wire for reshaping the coiled wire to define an antenna portion having a predetermined area for sending or receiving radio wave; and wherein a thickness of a portion of the insulation coating layer of the antenna portion is reduced, wherein the antenna portion is in a coiled configuration which is flattened and forms a one-piece, continuous planar body.

8. A method of manufacturing an electrical component as set forth in claim 7, wherein the temperature of heat is less than a melting point of a raw material of the insulating coating layer of the insulation wire.

9. A method of manufacturing an electrical component as set forth in claim 7, wherein the temperature of heat is not less than a melting point of a raw material of the insulating coating layer of the insulation wire.

10. A method of manufacturing an electrical component as set forth in claim 7, wherein the compression of the insulation wire is established in such manner that the insulation wire is sandwiched in a first direction between a pair of opposed devices, at least one of the devices being heated up to the temperatures.

11. A method of manufacturing an electrical component as set forth in claim 7, wherein the compression of the insulation wire is established in such manner that the insulation wire is sandwiched in a first direction between a pair of opposed devices, at least one of the devices is heated up to the temperature and is also sandwiched in a second direction perpendicular to the first direction between another pair of opposed devices, at least one of the four devices being heated up to the temperatures.

12. An electrical component comprising an electrode portion for detecting changes of capacitance between the electrode portion and a detected subject, the electrode portion comprising an insulation wire including an electrically conductive core surrounded by an insulation coating layer, the insulation wire being arranged in a meandering configuration which is flattened and forms a one-piece, continuous planar body.

13. An electrical component as set forth in claim 12, wherein neighboring portions of the meanderingly arranged insulation wire are integrated.

14. An electrical component as set forth in claim 13, wherein the integration is established by thermal welding.

15. An electrical component according to claim 12, wherein the electrical component includes a waterproof connector terminal caulked at one end of the insulation wire.

16. A door handle comprising:
- a handle main body;
- a handle cover covering the handle main body, the handle main body and the handle cover defining an inner shell; and
- an electrical component provided in the inner shell, the electrical component including an electrode portion for detecting changes of capacitance between the electrode portion and a detected subject in response to a hand approaching or touching the door handle, the electrode portion comprising an insulation wire including an electrically conductive core surrounded by an insulation coating layer, the insulation wire being arranged in a meandering configuration which is flattened and forms a one-piece continuous planar body.

17. A door handle according to claim 16, wherein neighboring portions of the meanderingly arranged insulation wire are integrated.

18. A door handle according to claim 17, wherein the integration is established by thermal welding.

19. A door handle according to claim 17, wherein the electrical component includes a waterproof connector terminal caulked at one end of the insulation wire.

20. A door handle according to claim 16, wherein one end of the insulation wire is guided to the outer side of the door handle.

* * * * *